United States Patent [19]

Giesecke et al.

[11] Patent Number: 4,753,821

[45] Date of Patent: Jun. 28, 1988

[54] PROCESS FOR THE PARTIAL METALLIZATION OF SUBSTRATE SURFACES

[75] Inventors: Henning Giesecke, Leverkusen; Gerhard D. Wolf, Dormagen; Ulrich von Gizycki; Reinhart Matejek, both of Leverkusen, all of Fed. Rep. of Germany

[73] Assignee: Bayer Aktiengesellschaft, Leverkusen, Fed. Rep. of Germany

[21] Appl. No.: 103,761

[22] Filed: Oct. 2, 1987

Related U.S. Application Data

[63] Continuation of Ser. No. 774,779, Sep. 11, 1985, abandoned.

[30] Foreign Application Priority Data

Sep. 19, 1984 [DE] Fed. Rep. of Germany ....... 3434431
Feb. 2, 1985 [DE] Fed. Rep. of Germany ....... 3503566

[51] Int. Cl.$^4$ ............................................. B05D 5/12
[52] U.S. Cl. ..................... 427/98; 427/304; 427/305; 427/306; 427/443.1; 430/417
[58] Field of Search ................. 427/98, 306, 305, 304, 427/443.1; 430/417

[56] References Cited

U.S. PATENT DOCUMENTS

| | | | |
|---|---|---|---|
| 3,994,727 | 11/1976 | Polichette | 427/98 |
| 4,059,445 | 11/1977 | Sato | 430/417 |
| 4,178,180 | 12/1979 | Vinal | 430/417 |
| 4,262,085 | 4/1981 | Ehrich | 430/417 |
| 4,511,597 | 4/1985 | Teng | 430/417 |
| 4,560,643 | 12/1985 | Finter | 430/417 |
| 4,568,570 | 2/1986 | Giesecke | 427/304 |

*Primary Examiner*—Shrive P. Beck
*Assistant Examiner*—Vi Duong Dang
*Attorney, Agent, or Firm*—Sprung Horn Kramer & Woods

[57] ABSTRACT

A process suitable for the fully additive technique for the electroless partial metallization of substrate surfaces consists in treating the surface with photosensitive silver(I) compounds (e.g. carboxylic acid salts), partially exposing the silver(I) compounds left behind on the surfaces, if necessary intensifying the exposure effect and/or exchanging the silver produced during the exposure for nobler metals, and detaching the unexposed silver(I) compounds.

9 Claims, No Drawings

PROCESS FOR THE PARTIAL METALLIZATION OF SUBSTRATE SURFACES

This is a continuation of application Ser. No. 774,779, filed Sept. 11, 1985 now abandoned.

Printed circuit boards for electronic engineering are manufactured predominantly by the so-called subtractive technique (G. Hermann: Leiterplatten-Herstellung und Verarbeitung (Printed circuit board manufacture and processing), Eugen G. Leuze Verlag, Saulgau/-Württ. 1978). It is only a few years since the introduction of the semi-additive technique, which manages with fewer process steps than the subtractive technique and produces smaller amounts of copper waste, but which, however, still has to rely on masking and etching processes, was initiated. Still simpler is the fully additive technique, especially a lacquer-free photoadditive variant, since this technology requires only about half the process steps of the subtractive technique and is the process which is most economic in raw material and most ecologically harmless. However, until now it has not been possible to solve the technical problems of a lacquer-free fully additive technique adequately. The sequence of process operations in this technique can be subdivided essentially into 3 sections.

1. Pretreatment of the base material (i.e. cutting to size, drilling of the holes, mechanical pretreatment and, if necessary, chemical digestion).
2. The photochemical image transfer to the base material (i.e. application of the activator, exposure through a photomask and nucleus stabilisation).
3. The building-up of the conductor tracks by chemical metallisation (i.e. premetallisation, thick copper plating and, if necessary, surface protection).

From the literature a number of processes are known for enabling the photosensitivity of chemical compounds or chemical reactions to be exploited for photoselective metallisation. A number of these processes are described, for example, in Galvanotechnik 74 (1983), page 1523. Until now none of these processes has been able to prevail over the subtractive technique.

It was therefore a surprise that a process was found for light-induced metal precipitation (LIMP process) which makes it possible to use the photosensitivity of silver(I) compounds for partial electroless metallisation.

The new process is carried out in a manner such that (a) the substrate surfaces to be partially metallised are wetted with a solution or coating paste of silver(I) compounds which are photosensitive in the solid state, (b) the solvent is removed, and consequently finely divided photosensitive silver(I) compounds are deposited on the surfaces, (c) the silver(I) compounds left behind are partially exposed to light, (d) if necessary the effect of the exposure is intensified by the action of heat and/or treatment with a photographic developer and/or the silver produced during the exposure to light is replaced by a nobler metal by an exchange reaction, (e) the unexposed silver(I) compounds are detached from the substrate surfaces and (f) the substrate surfaces partially activated in this way at the exposed points are electrolessly metallised in a manner known per se.

The photosensitivity of silver(I) compounds is a phenomenon which has been known for a long time and which has found wide technical application in photography. However, attempts to partially metallise exposed photographs using the catalytic activity of the silver nuclei present at the blackened points were unsuccessful.

Silver(I) compounds suitable for the new process according to the invention are, for example, known from photography. Without limiting the scope of the invention, reference should be made to the summary in "Ullmann's Enzyklopädie der technischen Chemie" ("Ullmann's Encyclopaedia of Industrial Chemistry"), 4th edition, volume 18, pages 399 to 500, published by Verlag Chemie, Weinheim, or to H. Frieser, G. Hase and E. Klein: Die Grundlagen der fotografischen Prozesse mit Silberhalogeniden (The fundamentals of photographic processes using silver halides), published by Akad. Verlagsgesellschaft Frankfurt, 1968.

Preferred compounds are

Silver(I) halides such as chloride, bromide, iodide, silver(I) carbonate, silver(I) borate, silver(I) salts of organic carboxylic acids such as, for example, formic acid, acetic acid, propionic acid etc., glycolic acid, lactic acid, oxalic acid, malonic acid, citric acid, adipic acid, benzoic acid, salicylic acid, hippuric acid, pyroterebic acid, silver(I) salts of phenols and enols such as, for example, silver picrate, silver cyanurate, Silver salts of sulphonic acids and sulphinic acids such as, for example, silver phenol sulphonates.

Particularly preferred are the silver salts of carbonic acids.

In addition, mixtures of photosensitive silver(I) compounds can also be used. To increase the photosensitivity, foreign ions such as, for example, $Cu^{2+}$ and $Au^{3+}$, whose incorporation can lead to the formation of crystal defects in the solid silver(I) compounds, can also be added to the solutions according to the invention.

Incidentally, it is not absolutely necessary to use the photosensitive compounds according to the invention as defined pure substances. Since dissociated ions may be present in the preferred solutions according to the invention, it is also possible to use salt mixtures, from which the photosensitive compounds are produced when the solvent is removed. Thus, for example, instead of an ammoniacal silver oxalate solution, a solution of silver nitrate, oxalic acid and ammonia can also be used.

An increase in the photosensitivity of the silver(I) compounds can also be achieved by addition of sensitisers. Such sensitisers are known in photography and photochemistry. The constitution and concentration of such compounds is described, for example, in "Ullmann's Enzyklopädie der technischen Chemie", 4th edition, volume 18, pages 430 to 434. Sensitisers whose absorption maximum lies in the UV are quite exceptionally suitable.

The concentration of the solutions or coating pastes of the silver(I) compounds to be used according to the invention should be 0.5 g to 75 g, preferably 5 to 30 g, Ag per liter.

In particular, water, DMF, DMSO, dimethylacetamide, aliphatic alcohols and diols and polyols such as, for example, ethylene glycols or glycerine may be considered as solvents. Mixtures of such solvents or blends with other organic solvents can also be used.

The solutions or coating pastes according to the invention may also contain additives for improving their properties. As examples mention may be made of film-forming substances such as polyvinyl alcohols or surface-active compounds such as viscosity-reducing substances.

Preferably, the solutions or coating pastes are free of these substances and in particular free of film-forming and other polymeric substances.

For silver(I) compounds which are sparingly soluble in the solvents preferred according to the invention, a preferred process variant is to convert these compounds into a soluble form by means of complexing agents, to wet the surfaces to be metallised with the solvents for the latter and then to break the soluble complex compounds left behind on the surfaces back down into the sparingly soluble compounds.

For the process variant, particularly suitable complexing agents for dissolving the sparingly soluble silver compounds are nitrogen-containing compounds which give rise to complexes which can easily be broken down by the action of heat and/or acids. Particularly preferred in aqueous solution is ammonia, in addition amines can also be used, but their boiling point should however by preference be below 100° C. In principle, other complexing agents such as, for example, cyanide ions can also be used.

The complex compounds left behind on the substrate surfaces are broken down again by the action of heat, it being necessary to choose temperature and drying conditions in a manner such that the surfaces of the substrates are not attacked. In general, temperatures of 0° C. to 200° C., preferably 50° C. to 150° C., are used in this process; in special cases (freeze-drying, firing) it is also possible to go below or to exceed these temperatures.

However, it is also possible to precipitate the sparingly soluble silver salts on the moistened surfaces by means of a chemical reaction. As an example, mention may be made of the acidification of a silver amine chloride solution with mineral acids which results in the precipitation of silver chloride. In these cases even the removal of the complexing agent is no longer necessary.

The surfaces to be partially metallised are wetted with the solutions or coating pastes according to the invention. For this purpose the wetting can, for example, take place by dipping the surface or by spraying on or brushing on the solutions. Before the wetting it may be necessary to improve the wettability of the substrate surfaces and/or the adhesive strength of the metal layer deposited later by a pretreatment. As an example of this, mention may be made of the chromosulphuric acid pickling of ABS plastics or of glass-fibre reinforced epoxy resins with adhesion-promoting layers.

Furthermore, it is also possible to apply the solutions by stamping, by printing methods or by the ink-jet method.

The wetting is carried out at temperatures between 0° C. and 90° C. In special cases the temperature may also be lower or higher. Very special preference is given to working at 15° C. to 40° C.

After the wetting, the solvent or pasting agent is removed. By preference this takes place through the action of heat, it being necessary to choose temperature and drying conditions in a manner such that the surfaces of the substrate are not attacked. In general temperatures of 0° C. to 200° C., preferably 50° to 150° C., are used for this process; in special cases (freeze-drying, firing) it is also possible to go below or exceed these temperatures.

Naturally, in the case of the variant according to the invention which consists in converting sparingly soluble silver(I) compounds into a soluble form by complex formation, it is necessary subsequently to remove the complexing agent as already described.

After this process step, solid, photosensitive silver(I) compounds are left behind on the substrate surfaces.

The photosensitive substrate surfaces activated in this way are then partially exposed. For this purpose the following are in particular possible as light sources: visible light (with suitable sensitisers), UV light, and X-ray and electron beams. Particularly preferred is an exposure in the UV range.

The exposure time depends on the beam intensity and the wavelength of the light source used. It may range from seconds up to 1 hour. If very high energy radiation is used (laser) the exposure time may be even lower.

The exposure may be carried out in the presence of heat which, as is known, may result in an acceleration of the photochemical reduction of silver salts.

In general the partial exposure takes place using a suitable mask.

Other partial exposure processes can also be used, e.g. "drawing" the conductor tracks, if necessary under computer control, on the surfaces by means of a finely focused light source.

The effect of partial exposure can, if necessary, be intensified by a further process step. Suitable processes are known from photography under the term "development". For this purpose the developers commonly used in photography can be used. As regards their chemical constitution, reference should be made to the summary in "Ullmann's Enzyclopädie der technischen Chemie", 4th edition, volume 18, pages 399–500. Suitable formulations are available commercially (e.g. under the trade name "Neutrol" made by Agfa, Leverkusen). Naturally, for such a development other redox systems can also be used whose redox potential can be so adjusted that only the exposed silver nuclei are reduced. As examples mention may be made of formalin solutions and hypophosphite solutions, the redox potential of which can be adjusted by means of the pH value.

The exposure effect can also be intensified by a heat treatment, if necessary in the presence of ammonia vapours. Such a process can be used for the activation if, for example, silver oxalate is used.

The substrate surfaces partially exposed in this way can then be subjected to an exchange reaction by means of which silver produced during the exposure is exchanged for nobler metals. These are to be understood as metals whose oxidation potentials in aqueous solution measured under standard conditions against the normal hydrogen electrode are more positive (or according to the US Standard more negative) than that of silver.

Particular preference is given to the use of metals such as gold, platinum or preferably palladium, which, moreover, exhibit a high catalytic action in the electroless (chemical) metallisation. Mixtures of the noble metals can also be used.

Preferably the exchange reaction according to the invention is carried out by treating the partially exposed substrate surfaces with a solution of these noble metals. For the preparation of these solutions, salts, complex compounds and/or organometallic compounds of the noble metals can be used.

As solvents water, DMF, DMSO, dimethylacetamide, aliphatic alcohols, and also diols and polyols such as, for example, ethylene glycols or glycerine, and also, for organometallic compounds, organic solvents such as, for example, chlorinated aliphatic compounds, aliphatic esters or ketones receive particular consideration. Mixtures of such solvents or blends with other solvents can also be used.

Particularly preferred is a process in which the exchange is carried out in an acid, predominantly aqueous solution of noble metal salts.

The concentration of noble metals in the exchange solutions is between 0.05 g and 10 g per liter. Solutions which contain between 0.1 g and 2 g of noble metal per liter are preferred.

The exchange reaction is carried out at temperatures between 0° C. and 90° C. In special cases the temperature can also be lower or higher. Very special preference is given to working at 15° C. to 40° C.

The reaction time is between 10 seconds and 30 minutes. In special cases the times may also be shorter or longer. Residence times between 1 minute and 10 minutes are preferred.

The exchange of the silver for nobler metals according to the invention has a number of advantages. The higher catalytic activity of the nobler metals has the result that a smaller number of catalytically active nuclei is necessary for a satisfactory partial metallisation. Both the exposure times and the concentration of photosensitive silver salts per unit area to be partially exposed can therefore be reduced. In addition, more stable electroless baths which prevent spontaneous metal depositions and irregular growth can be used for the metallisation of the surfaces. As a result of this, the imaging accuracy of the process can be increased, and this is in particular of considerable interest for the fine-line technique.

After the exchange reaction, a rinsing process for the removal of unconverted noble metals is necessary.

The unexposed silver(I) compounds are then again detached from the partially exposed surfaces which have been subjected, if necessary, to an exchange reaction. Suitable processes are known from photography by the term "fixing". In this context it has proved particularly advantageous if sulphur-free solutions are used to detach the unexposed silver compounds. In the context of the invention, by sulphur-free is meant in this connection that the fixing solution does not contain any sulphidic sulphur or any sulphur compounds from which sulphur is split off by reaction with silver.

For the new process according to the invention, fixing solutions receive special consideration which contain ammonia, ammonium salts, amines or amino acids and their mixtures. Very special preference is given to the use of aqueous solutions. In addition, blends of water with organic solvents or alcoholic solutions can also be used.

The concentration of substances which detach silver salts is in general between 1 and 500 g per liter.

Preferably between 5 and 200 g per liter are used. The residence time in the fixing solution depends on the concentration and the effectiveness of the substances which detach the unexposed silver. In general it is between 1 second and 15 minutes. Times between 10 seconds and 10 minutes are preferred.

The temperature for fixing is between 0° C. and 90° C. By preference the unexposed silver is detached at temperatures between 15° C. and 60° C.

Movement of the fixing solution or of the substrate surfaces in the solutions is of advantage.

It is also possible to fix the partially exposed surfaces first and only then carry out the exchange reaction.

Most of the silver used can be recovered again from the fixing solutions and from the exchange solutions. Suitable processes are known from photography.

The substrate surfaces partially activated in this way are then electrolessly metallised. Electroless metallising baths are adequately known from electroplating. Baths containing nickel salts, cobalt salts, copper salts or mixtures of these with iron salts, gold and silver salts receive consideration by preference.

If necessary, the partially electrolessly metallised surfaces can subsequently be reinforced by electro-plating.

As substrates for the process according to the invention glass, quartz, ceramic, carbon, paper, polyethylene, polypropylene, ABS plastics materials, epoxy resins, polyesters, polycarbonates, polyamides, polyethylene fluoride and textile surface structures of polyamide, polyester, polyalkylene, polyacrylonitrile, polyvinyl halides, cotton and wool and also mixtures of these or mixed polymers and also aluminium oxide are suitable. Particularly preferred are substrates such as are used in printed circuit board manufacture, e.g. phenolic resin papers, glass-fibre reinforced epoxy boards and ceramic, which, if necessary, have to be "roughened up" by a suitable pretreatment to improve the adhesion of the activation nuclei to the surface.

EXAMPLE 1

A piece of paper 10×5 cm in size is dipped for 10 seconds in an ammoniacal aqueous solution of 20 g silver(I) chloride and dried. The piece of paper is then half-covered and irradiated for 20 minutes with a 125 watt high-pressure mercury lamp (distance 60 cm). The substrate is then soaked for 10 minutes in a 10% ammonium nitrate solution which has been adjusted to pH 9 with ammonia, rinsed and then metallised for 20 minutes in an electroless amine-borane-containing nickel bath. A piece of paper is obtained which has only been nickel-plated at the exposed points.

EXAMPLE 2

A board of ABS plastics material 5×5 cm in size is pickled for 10 minutes at 65° C. in chromic acid, detoxicated and then dipped in an ammoniacal aqueous solution which contains 51 g of silver nitrate and 21 g of citric acid per liter, and dried at 50° C. A photomask is then fixed directly on the surface of the board by means of a quartz-glass plate and the ABS board is exposed through the mask from a distance of 10 cm with a 250 watt mercury lamp for 15 minutes. After the exposure the conductor-track pattern of the photomask is clearly discernible on the surface of the board. The exposed board is then soaked for 5 minutes in a 30% ammonium nitrate solution which has been adjusted to pH 9.3 with ammonia, rinsed and then reduced for 20 minutes in a 0.1% aqueous sodium boron hydride solution. After copper plating for 1 hour in an electroless formalin-containing copper bath at 60° C., an ABS board with clearly discernible, copper-plated conductor tracks is obtained.

EXAMPLE 3

An epoxy resin board filled with glass-fibre (FR 4) 10×5 cm in size which has been coated with an adhesion-promoting layer on both sides, is pickled for 2 minutes at 65° C. in chromic acid, detoxicated and then wetted with an ammoniacal aqueous solution of 30 g silver(I) citrate by rolling on.

The FR 4 board is subsequently dried and then exposed by means of a mercury lamp in accordance with Example 2 through a photomask for 10 minutes. After exposure, the image of the conductor track pattern of the photomask is clearly discernible on the surface of the board. The exposed board is subsequently soaked for 10 minutes in a 10% aqueous ammonia solution, rinsed and then immediately copper plated in an electroless formalin-containing copper bath at 60° C. An FR 4 board with clearly discernible copper-plated conductor tracks separated from each other is obtained.

EXAMPLE 4

A ceramic plate 5×5 cm in size is sprayed with an ammoniacal aqueous solution which contains 25 g of silver nitrate per liter and 15 g of oxalic acid per liter. The plate is subsequently dried at 40° C. and then exposed through a photomask in accordance with Example 2 for 20 minutes. The exposed plate is soaked for 10 minutes in a 40% ammonium nitrate solution which has been adjusted to pH 9 with ammonia, rinsed and then dried at 200° C. As a result of metallising in an amine-borane-containing nickel bath (30 minutes), a ceramic plate with nickel-plated conductor tracks is obtained.

EXAMPLE 5

A pickled ABS board according to Example 2 is wetted with a suspension of 20 g of silver oxalate per liter of ethylene glycol and dried at 70° C. in a vacuum drying cabinet. Subsequently the board is exposed for 20 minutes with exposure equipment in accordance with Example 2 through a photomask. After exposure, the image of the conductor track pattern of the photomask is clearly discernible on the surface of the board. The board is subsequently soaked for 20 minutes in a 25% aqueous ethylamine solution, rinsed and then immediately metallised for 30 minutes in an electroless amine-borane-containing nickel bath. An ABS board with clearly discernible nickel-plated plated conductor tracks separated from each other is obtained.

EXAMPLE 6

1 g of polyvinyl alcohol and 15 g of silver nitrate are dissolved in 500 ml of water with heating and vigorous stirring. Subsequently a solution of 20 g of sodium bromide in 500 ml of water is added with vigorous stirring in the dark. An epoxy board filled with glass fibre in accordance with Example 3 is wetted with the suspension produced by this process by dipping. The FR 4 board is subsequently dried and then exposed through a photomask for 1 hour with exposure equipment in accordance with Example 2. The image of the conductor track pattern of the photomask is then clearly discernible on the board. The board is soaked for 30 minutes in a 25% ammonia solution and then for 2 minutes in a 1% aqueous amine-borane solution. After nickel plating for 2 hours in an electroless hypophosphite-containing nickel bath at 40° C., an FR 4 board with clearly discernible nickel-plated conductor tracks is obtained.

EXAMPLE 7

A board of ABS plastics material (acrylonitrile/-butadiene/styrene terpolymers) 10×12 cm in size is pickled for 10 minutes at 65° C. with chromic acid, detoxicated and subsequently dipped in an ammoniacal aqueous solution which contains per liter 35 g silver nitrate and 40 g citric acid, and dried at 50° C. Subsequently a photomask is fixed directly on the surface of the board by means of a quartz-glass plate and the ABS board is exposed through the mask from 12 cm distance with a 250 watt mercury lamp for 15 minutes. After the exposure, the conductor track pattern of the photomask is clearly discernible on the surface of the board. The exposed board is subsequently dipped for 1 minute in a 0.1% hydrochloric palladium(II) chloride solution, then rinsed for 30 seconds with distilled water and then soaked for 5 minutes in a 40% ammonium nitrate solution which has been adjusted to pH 9.0 with ammonia. After careful rinsing with water, the board is metallised for 1 hour in an amine-borane-containing nickel bath. An ABS board with clearly discernible nickel-plated conductor tracks separated from each other is obtained.

EXAMPLE 8

An epoxy resin board filled with glass fibre (FR 4) 10×20 cm in size, which has been coated on both sides with an adhesion-promoting layer, is wetted by rolling on with an ammoniacal aqueous solution of 40 g silver(I) citrate, the viscosity of which has been increased by 2% addition of a polyacrylic acid. The FR 4 board is subsequently dried and then exposed for 10 minutes by means of a mercury lamp in accordance with Example 1 through a photomask. After the exposure, the image of the conductor track pattern of the photomask is clearly discernible on the surface of the board. Subsequently the exposed board is dipped for 10 minutes in a hydrochloric acid solution which contains 0.5 g $AuCl_3$ per liter, and subsequently rinsed. The exposed board is then soaked for 10 minutes in a 10% aqueous ammonia solution, rinsed and then immediately copper plated for 1 hour in an electroless formalin-containing copper bath at 60° C. An FR 4 board with clearly discernible copper-plated conductor tracks separated from each other is obtained.

EXAMPLE 9

A ceramic plate 5×5 cm in size is sprayed with an ammoniacal aqueous solution which contains 30 g of silver nitrate per liter and 30 g of oxalic acid per liter. Subsequently the plate is dried at 80° C. and then exposed through a photomask in accordance with Example 1 for 20 minutes. The exposed plate is dipped for 10 minutes in a 10% potassium chloride solution which contains 2 g of potassium tetrachloroplatinate per liter. Subsequently the plate is rinsed, soaked in a 40% ammonium nitrate solution which has been adjusted to pH 9.5 with ammonia, rinsed, and then dried at 150° C. By metallising in an amine-borane-containing nickel bath (2 hours) a ceramic plate with nickel-plated conductor tracks is obtained.

EXAMPLE 10

A pickled ABS board in accordance with Example 1 is wetted with a suspension of 25 g of silver bromide per liter of ethylene glycol and dried at 70° C. in a vacuum drying cabinet. Subsequently the board is exposed for 30 minutes with exposure equipment in accordance with Example 1 through a photomask. After the exposure the image of the conductor track pattern of the photomask is clearly discernible on the surface of the board. The board is subsequently dipped for 15 minutes in an acetic acid solution which contains 0.5 g of $K_2PtCl_4$ per liter. The board is subsequently soaked for 20 minutes in a 25% aqueous ethylamine solution, rinsed, and then immediately metallised for 30 minutes in an electroless amine-borane-containing nickel bath.

An ABS board with clearly discernible nickel-plated conductor tracks separated from each other is obtained.

EXAMPLE 11

An epoxy resin board filled with glass fibre in accordance with Example 2 is wetted with an ammoniacal solution of 25 g of silver nitrate and 40 g of lactic acid in water/ethanol (9:1) by dipping and subsequently dried. Then exposure is carried out with a mercury lamp in accordance with Example 1 through a photomask for 15 minutes. After the exposure the image of the conductor track pattern of the photomask is clearly discernible on the surface of the board. Subsequently the exposed board is sprayed for 2 minutes with a hydrochloric acid solution of 2 g of $PdCl_2$ per liter of water.

Subsequently the board is rinsed, soaked at 45° C. in a 10% aminoacetic acid solution, which has been adjusted to pH 9 with ammonia, rinsed and then copper plated in an electroless formalin-containing copper bath at 40° C. for 3 hours. An FR 4 board with clearly discernible copper-plated conductor tracks separated from each other is obtained.

We claim:

1. In a process for the manufacture of printed circuit by electrolessly partially metallising of a substrate surface wherein
   (a) the substrate surface is wetted with a solution or a grinding paste of silver(I) compounds which are photosensitive in the solid state said solution or grinding paste being essentially free of film-forming and other polymeric substances,
   (b) the solvent is removed,
   (c) the silver(I) compounds remaining on the substrate surface are partially exposed,
   (d) the unexposed silver(I) compounds are detached from the substrate surfaces and
   (e) the thus obtained substrate surface is treated with an electroless metallising bath containing nickel salts, cobalt salts or copper salts the improvement wherein said silver(I) compounds are sparingly soluble in said solvent and are converted into a soluble form by means of complexing agents, the surfaces to be partially metallised are wetted with the solution of the latter and the complex compounds left behind on the surface are split up again into the photosensitive sparingly soluble compounds and wherein said sparingly soluble compounds and wherein said sparingly soluble silver(I) compounds are silver salts of an acid selected from the group consisting of formic acid, acetic acid, propionic acid, glycolic acid, lactic acid, oxalic acid, malonic acid, citric acid, adipic acid, benzoic acid, salicyclic acid, hippuric acid, pyroterebic acid, phenols, enols sulphonic acids and sulphinic acids.

2. A process according to claim 1, wherein ammonia or amines with a boiling point below 100° C. are used as complexing agents.

3. A process according to claim 1, wherein the concentration of silver(I) compounds in the grinding pastes or solutions is 0.5 to 7.5%.

4. A process according to claim 1, wherein sulphur-free fixing solutions are used to detach the unexposed silver(I) compounds from the surface.

5. A process according to claim 1, wherein said solvent is water.

6. A process according to claim 1, wherein, if necessary, prior to step (d) the silver produced during the exposure is exchanged for nobler metals.

7. A process according to claim 1, wherein, if necessary, the effect of the exposure is intensified by the action of heat and/or treatment with a photographic developer.

8. A process according to claim 6, wherein gold, platinum or palladium are used as nobler metals.

9. A process according to claim 6, wherein the exchange reaction is carried out by treating with a solution of salts, complexing agents, complexing agents and/or organometallic compounds of the noble metals.

* * * * *